United States Patent
Cagle et al.

(10) Patent No.: US 9,107,302 B2
(45) Date of Patent: Aug. 11, 2015

(54) DUMMY STRUCTURE FOR VISUAL AID IN PRINTED WIRING BOARD ETCH INSPECTION

(71) Applicant: Raytheon Company, Waltham, MA (US)

(72) Inventors: William L. Cagle, Sahuarita, AZ (US); Jeremy B. Baldwin, Tucson, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 242 days.

(21) Appl. No.: 13/765,268

(22) Filed: Feb. 12, 2013

(65) Prior Publication Data

US 2014/0224525 A1 Aug. 14, 2014

(51) Int. Cl.
| | | |
|---|---|---|
| H05K 1/00 | (2006.01) | |
| H01B 13/00 | (2006.01) | |
| H05K 1/02 | (2006.01) | |
| H05K 3/06 | (2006.01) | |

(52) U.S. Cl.
CPC ............... *H05K 1/0269* (2013.01); *H05K 3/06* (2013.01); *H05K 2201/09781* (2013.01)

(58) Field of Classification Search
CPC ..... H05K 1/0269; H05K 3/108; H05K 3/062; H05K 3/3452
USPC .......... 174/250, 261, 268; 216/13, 59, 60, 84, 216/85
See application file for complete search history.

(56) References Cited

U.S. PATENT DOCUMENTS

| | | | |
|---|---|---|---|
| 4,950,527 A | 8/1990 | Yamada | |
| 5,118,386 A * | 6/1992 | Kataoka et al. | 216/13 |
| 6,109,775 A | 8/2000 | Tripathi et al. | |
| 6,630,627 B1 | 10/2003 | Tobita | |
| 7,383,521 B2 * | 6/2008 | Smith et al. | 716/114 |
| 7,701,034 B2 * | 4/2010 | Chuang et al. | 257/508 |
| 8,221,635 B2 | 7/2012 | Hauff | |
| 2002/0088769 A1 * | 7/2002 | Antaki et al. | 216/59 |
| 2004/0044164 A1 * | 3/2004 | Engelbrecht | 528/15 |
| 2005/0093165 A1 * | 5/2005 | Morita | 257/773 |
| 2007/0034596 A1 | 2/2007 | Ueno et al. | |
| 2007/0113395 A1 | 5/2007 | Dulay et al. | |
| 2009/0109364 A1 | 4/2009 | Yang et al. | |
| 2009/0133902 A1 | 5/2009 | Kim et al. | |
| 2011/0278679 A1 | 11/2011 | Tabata et al. | |

OTHER PUBLICATIONS

International Search Report and Written Opinion; International Application No. PCT/US2013/073806; International Filing Date: Dec. 9, 2013; Date of Mailing: Apr. 18, 2014; pp. 1-11.

* cited by examiner

*Primary Examiner* — Hoa C Nguyen
(74) *Attorney, Agent, or Firm* — Cantor Colburn LLP

(57) ABSTRACT

A dummy structure for a printed wiring board (PWB) includes a unit shape defined on the PWB, the unit shape configured to, based on a visual inspection thereof, provide an indication of one of: etching of a PWB circuit element within a desired tolerance range, over etching of the PWB circuit element, or under etching of the PWB circuit element.

18 Claims, 5 Drawing Sheets

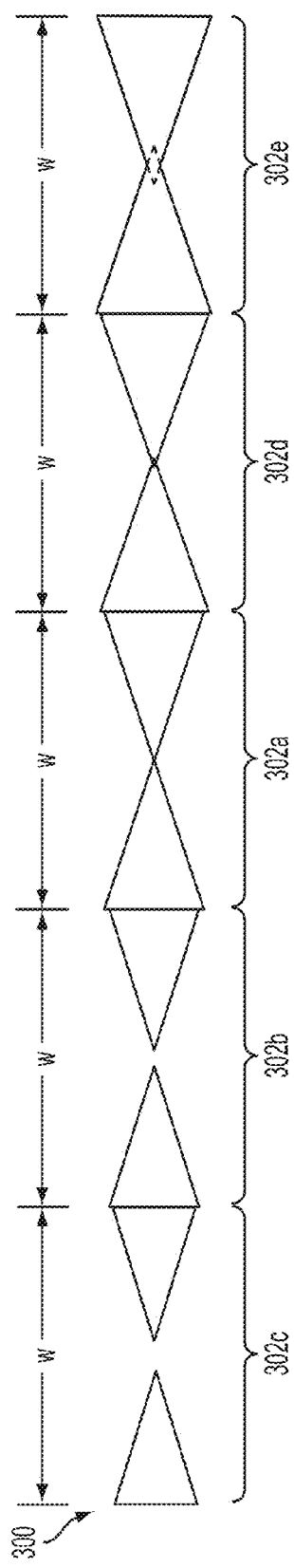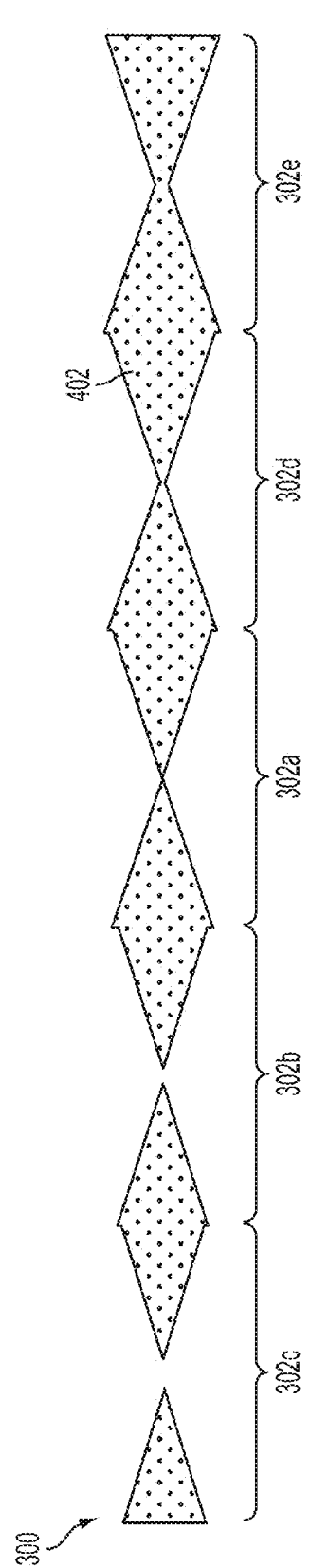
FIG. 3
FIG. 4

DUMMY STRUCTURE FOR VISUAL AID IN PRINTED WIRING BOARD ETCH INSPECTION

STATEMENT OF GOVERNMENT INTEREST

The present disclosure is developed under government contract N00024-07-C-5361 awarded by Naval Sea Systems Command. The Government may have certain rights in this invention.

BACKGROUND

The present disclosure relates generally to printed wiring board manufacturing and, more particularly, to a dummy structure and visual inspection method for printed wiring board etching.

Distributed filters are part of the toolkit for radio frequency (RF)/microwave design, and are mostly used at frequencies above the VHF (Very High Frequency) band (30 to 300 MHz). At these frequencies, the physical length of passive components is a significant fraction of the wavelength of the operating frequency, and it becomes difficult to use the conventional lumped element model. These distributed filters may be discrete, packaged devices soldered to a printed wiring board (PWB) as a surface mount component. Alternatively, to reduce cost, filters may be manufactured as part of the PWB so long as line widths and spacing of the components can be tightly controlled to guarantee filter performance. As is known in the art, printed wiring boards (PWB) are relatively difficult to fabricate. PWBs require multiple plating operations in some areas of the structure, and include etched circuits with small tolerances consisting of fine lines and/or fine gaps in other areas of the PWB. Similarly, any PWBs having etched circuits or other structures (e.g., hairpin band pass filter structures) and multiple plating steps are also relatively difficult to fabricate.

To fabricate such PWBs, prior art techniques carefully monitor fabrication and etching processes. Detail prints (i.e., fabrication drawings) define a final top layer plating thickness and also define an etch accuracy for certain top layer board features. As a result, a manufacturer (such as a fabrication or assembly house) may have to procure and produce additional duplicate PWBs in order to deliver one PWB which passes all inspections/tests and meets all of a purchaser's requirements, including critical operational requirements. PWBs which do not pass the required inspections/tests go unused. This results in wasted PWBs and higher unit cost per PWB. Requiring a PWB vendor to perform 100% measurements will also increase the cost. Moreover, even in the event a manufacturer states the PWBs meet a certain etching accuracy, it may be late into the build and integration phase of a product incorporating the PWB before such a defect is realized.

SUMMARY

In an exemplary embodiment, a dummy structure for a printed wiring board (PWB) includes a unit shape defined on the PWB, the unit shape configured to, based on a visual inspection thereof, provide an indication of one of: etching of a PWB circuit element within a desired tolerance range, over etching of the PWB circuit element, or under etching of the PWB circuit element.

In another embodiment, a method of forming a printed wiring board (PWB) includes forming a circuit element and a dummy structure on a substrate; and visually inspecting the dummy structure, and based on the appearance of the dummy structure determining one of: etching of the circuit element within a desired tolerance range, over etching of the circuit element, or under etching of the circuit element.

BRIEF DESCRIPTION OF THE DRAWINGS

For a more complete understanding of this disclosure, reference is now made to the following brief description, taken in connection with the accompanying drawings and detailed description, wherein like reference numerals represent like parts:

FIG. 3 illustrates a schematic view of a dummy structure for use in printed wiring board etching inspection, in accordance with another exemplary embodiment;

FIG. 4 is a top view of the dummy structure of FIG. 3, formed from a metal PWB material on a substrate;

DETAILED DESCRIPTION

Figure 1:
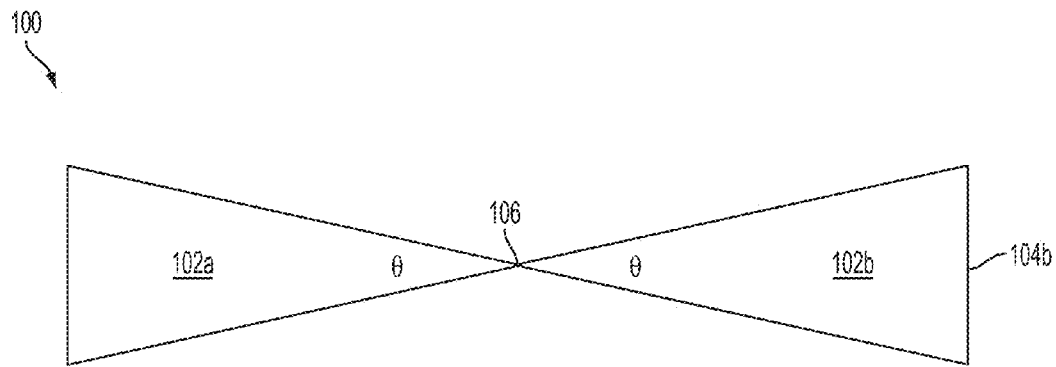
FIG. 1 illustrates a schematic view of a dummy structure for use in printed wiring board etching inspection, in accordance with an exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature(s) being described. Also, the description is not to be considered as limiting the scope of the embodiments described herein.

As indicated above, microwave distributed components are part of the standard design toolbox. These components include, but are not limited to, filters, couplers, splitters and antennas. Key performance characteristics (KPC) of all of these components include line widths and spacings, which must be tightly controlled. Often, these components are designed as separate, surface mount technology (SMT) devices procured through an external supplier. This approach, however, represents an additional cost (e.g., procurement, additional manufacturing steps, testing, etc.).

On the other hand, components included in a PWB design reduce the procurement and manufacturing costs, but may themselves include an increase in cost of the PWB due to additional geometric measurements required for critical parameters. In order to address the issue of requiring tight etching tolerances to achieve specific performance of etched microwave elements, a purchaser of such a component may perform 100% measurements upon incoming inspection or alternatively require that the seller provide this data. Either of these approaches, however, will result in an increase in the cost of the PWB.

Accordingly, disclosed herein is a dummy structure designed for use on a PWB, characterized by a geometric shape with an angle designed to provide a deterministic etch "amplification" (i.e., an indication of an etch within a desired tolerance or not within desired tolerance, whether an over etch or an under etch condition). That is, the dummy structure is a PWB artwork feature that determines etching dimensions of metallization elements on the PWB, wherein the shape of the dummy structure is specifically configured to provide a reliable visual indication of over/under etching.

In a further embodiment, the dimensions of a dummy structure unit shape are modified over a range of etch tolerances to provide a visual tool to determine the amount of over/under etching. By incorporating such a feature on PWBs that require tight etching tolerances, any individual associated with the life cycle of the circuit card assembly may inspect these features to determine etch tolerance (without the need for a costly measuring microscope). From the initial build up to and including testing and integration, this inspection data may assist in decision making with respect to proceeding (or not) with a current lot of PWBs. Moreover, such over/under etching data may help explain voltage standing wave ratio (VSWR) and other impedance matching issues seen at test and integration.

Referring initially to FIG. 1, there is shown a schematic view of a dummy structure 100 for use in printed wiring board etching inspection, in accordance with an exemplary embodiment. The dummy structure 100 is characterized by a pair of isosceles triangle regions 102a, 102b having opposing base sides 104a, 104b, respectively. Nominally, the apex vertices of the triangles meet at a common apex point 106 such that the dummy structure 100 resembles a "bow tie" shape. An apex angle, $\theta$, for the triangle regions 102a, 102b may be selected so as to provide a determinable etch "amplification" as described in further detail below.

Figure 2:
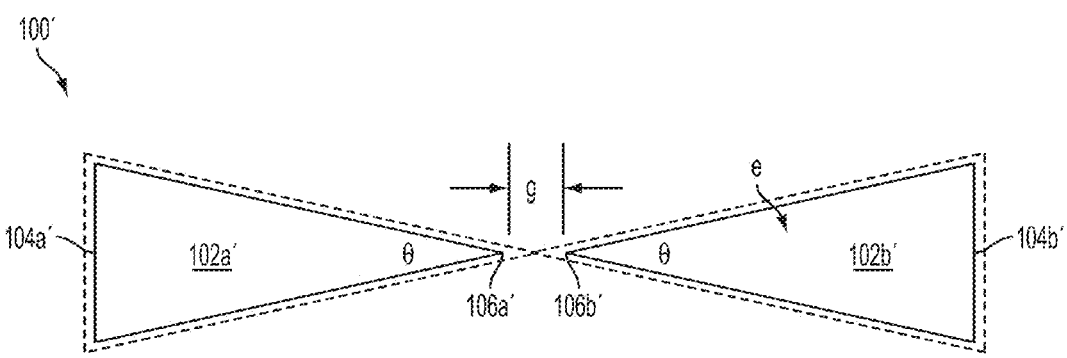
FIG. 2 is a schematic view of the dummy structure of FIG. 1 after an over etching process by which the degree of over etching leads to a visible gap in the dummy structure.

Referring now to FIG. 2, there is schematic view of the dummy structure of FIG. 1 after an over etching process by which the degree of over etching leads to a visible gap in the over etched dummy structure 100'. Here, the isosceles triangle regions 102a', 102b' are over etched such that the sides of triangle regions 102a', 102b' are reduced, including opposing base sides 104a', 104b'. As a result, instead of a single common apex point, the apex vertices 106a' and 106b' of triangle regions 102a', 102b' are clearly defined in FIG. 2, and are separated by a gap, g. The dashed region in FIG. 2 indicates the nominal shape of the dummy structure 100 of FIG. 1, where no over or under etching has occurred. In the example depicted, e represents the etching error (which is positive for an over etching condition). As e increases, the gap, g, between the triangle regions 102a', 102b' increases as well. For an apex angle of $\theta=29°$, g=4e. As will be appreciated, where e is negative (under etching), then the apex vertices of the triangle regions would overlap one another, as illustrated in further detail below.

A more elaborate version of a dummy structure is illustrated in the schematic diagram of FIG. 3. As is shown, the dummy structure 300 includes a plurality of unit shapes 302a though 302e arranged in an array. Typically, the available tolerance on line widths and spacings from a PWB vendor (without a significant cost increase) is about +/−1 mil ($\frac{1}{1000}^{th}$ inch or 25.4 microns (μm)). The arrangement of the dummy structure 300 for an improved visual aid in inspection by providing a size range of unit shapes. Here, the original shape from FIG. 1 (i.e., a pair of isosceles triangle regions having opposing base sides and meeting at a common apex point) is represented as unit shape 302a in FIG. 3.

To the immediate left of unit shape 302a is unit shape 302b. In this case, the triangle dimensions are reduced by a specific amount (e.g., 0.5 mils) such that a gap appears between the opposing triangles of unit shape 302b. It will be noted that the distance, w, between the base sides of the opposing triangles is constant for each unit shape. Again, if the apex angle is chosen to be about 29°, then the apex gap is about 0.5 mils× 4=2.0 mils. It should be appreciated that the dummy structure 300 is not necessarily depicted to scale, but is illustrative only. To the immediate left of unit shape 302b is unit shape 302c. In this case, the triangle dimensions are further reduced by a specific amount (e.g., 1.0 mil with respect to unit shape 302a) so as to result in an even larger gap between the opposing triangles of unit shape 302c. Using the example of a 1.0 mil reduction in triangle size, and keeping the same base distance, w, the gap between triangles of unit shape 302c increases to about 4.0 mils.

In contrast, to the immediate right of unit shape 302a is unit shape 302d. In this case, the triangle dimensions are increased by a specific amount (e.g., 0.5 mils) such that the apex vertices of the opposing triangles of unit shape 302d begin to overlap one another. This configuration represents an under etch condition where, instead of the triangle apex vertices meeting at a common point, they begin to merge such that the midpoint of the unit shape 302d has a definitive thickness in the y-direction. To complete the dummy structure 300, another unit shape 302e is disposed to the immediate right of unit shape 302d. Here, the triangle dimensions are further increased by a specific amount (e.g., 1.0 mil with respect to unit shape 302a) so as to result in an even larger overlap between the opposing triangles of unit shape 302e. That is, the midpoint of unit shape 302e assumes an even larger thickness in the y-direction.

FIG. 4 is a top view of the dummy structure of FIG. 3, shown formed on a substrate 400 from a PWB metal 402. When actually patterned and etched on a PWB, the dummy structure metal 402 will appear as diamond-like shapes, owing to the base sides of the unit shapes 302a-302e directly abutting one another. The dummy structure 300 depicted in FIG. 4 represents the appearance of the structure in the event that the PWB etching is performed in accordance with a desired tolerance range (e.g., +/−1 mil in 0.5 mil increments). That is, the midpoint of unit shape 302a should appear as if the triangle apex vertices are just touching one another, the midpoint of unit shape 302b should define a small gap, and the midpoint of unit shape 302c should define a larger gap. In addition, the midpoint of unit shape 302d will appear as slightly merged with a definitive center thickness in the y-direction, while the midpoint of unit shape 302e will have a noticeably larger center thickness in the y-direction.

On the other hand, if the PWB is slightly over etched, then the midpoint of unit shape 302a will show a slight gap between the opposing triangles, similar to the appearance of a correctly etched unit shape 302b. An over etched unit shape 302b will in turn appear like a correctly etched unit shape 302c, etc. Conversely, a slightly under etched PWB will result in the unit shape 302a appearing more like a correctly etched unit shape 302d. It will thus be appreciated that a dummy structure 300 having a plurality of unit shapes can provide a sliding scale for a convenient and easy visual determination as to whether a PWB has been etched to a desired tolerance. Presented below are examples of etched PWB band pass filters and associated dummy structures.

Example 1

Figure 5:
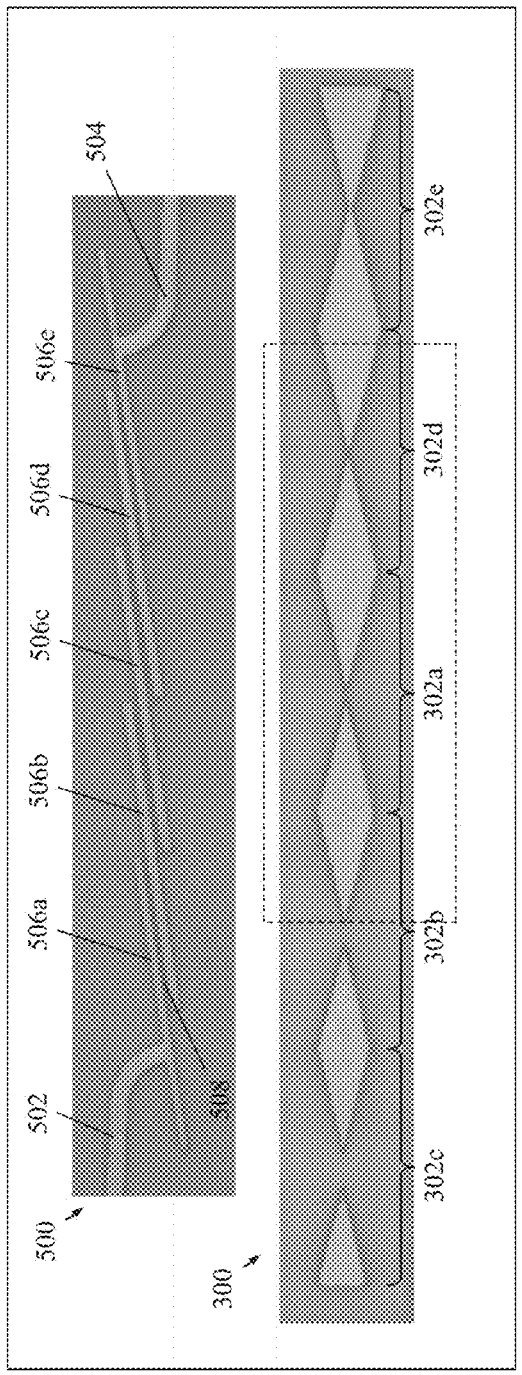
FIG. 5 is an image of a distributed band pass filter and associated dummy structure, in which etching is performed to a desired tolerance.

Referring now to FIG. 5, there is shown an image of a distributed band pass filter 500 and associated dummy structure 300, in which etching was performed to a desired tolerance. In the example depicted, the band pass filter 500 has first and second conductive lines 502, 504, separated by a plurality of $\lambda/2$ resonators 506a-506e, each coupling over $\lambda/4$ to the neighboring resonator(s). For a component such as the band pass filter 500, the input/output return loss (and ultimately passband ripple) is very sensitive to the first resonator gap 508 between resonator 506a and resonator 506b. In this particular design, the first resonator gap 508 is ideally 5.0 mils. Measurements determined that the actual first resonator gap 508 of the etched filter was 5.1 mils, within an acceptable tolerance.

Figure 6:
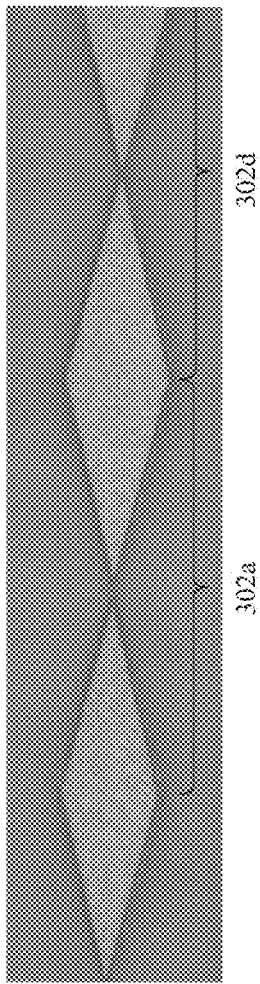
FIG. 6 is an enlarged view of the dashed portion of the dummy structure of FIG. 5.

More significantly, the appearance of the dummy structure 300 in FIG. 5 reflected the desired etching performance, since the midpoint of unit shape 302a appears as if the triangle apex vertices are just touching one another, the midpoint of unit shape 302b defines a small gap, and the midpoint of unit shape 302c defines a larger gap. In addition, the midpoint of unit shape 302d appears as slightly merged with a definitive center thickness in the y-direction, while the midpoint of unit shape 302e has a noticeably larger center thickness in the y-direction. FIG. 6 is an enlarged view of the dashed portion of the dummy structure of FIG. 5, more particularly illustrating unit shapes 302a and 302d having the expected etch characteristics as described above.

Example 2

Figure 7:
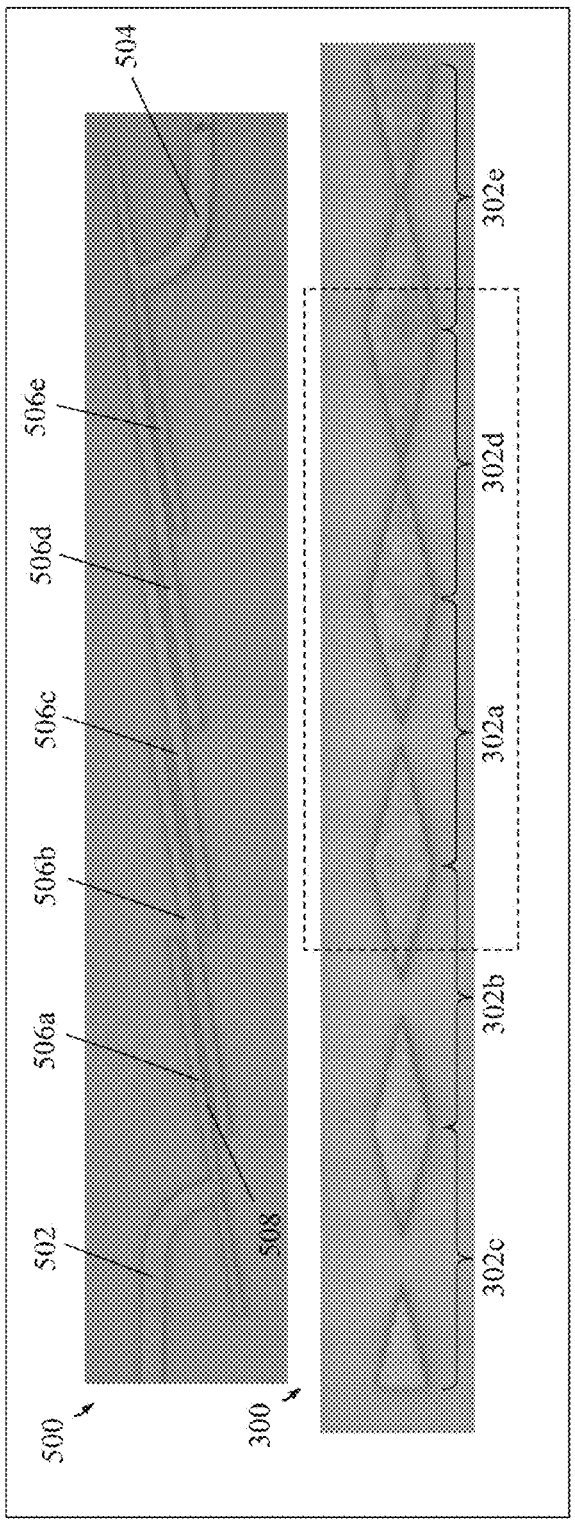
FIG. 7 is an image of a distributed band pass filter and associated dummy structure, in which etching is performed beyond a desired tolerance.
Figure 8:
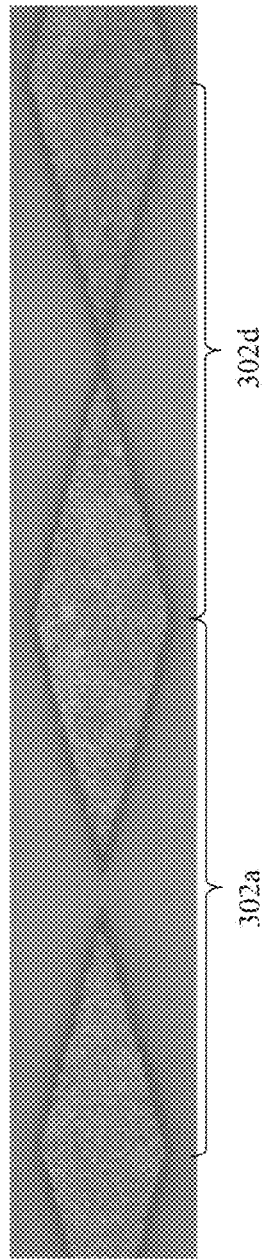
FIG. 8 is an enlarged view of the dashed portion of the dummy structure of FIG. 7.

By way of contrast, FIG. 7 is an image of the same distributed band pass filter 500 and associated dummy structure 300, in which etching is performed beyond a desired tolerance. More specifically, the band pass filter 500 was over etched such that the actual first resonator gap 508 measured 5.7 mils, beyond the desired tolerance. Furthermore, this over etch condition was seen by a visual inspection of the dummy structure 300. As shown in both FIG. 7 and the enlarged view of FIG. 8, the midpoint of unit shape 302a is now open instead of having the triangle regions meet at a common apex. That is, unit shape 302a of the over etched structure in FIGS. 7 and 8 resembles unit shape 302b of a correctly etched structure (e.g., as in FIGS. 3-5). Also, unit shape 302d of the over etched structure in FIGS. 7 and 8 resembles unit shape 302a of a correctly etched structure, in that the triangle regions meet at a common apex instead of having a thicker connection at the midpoint.

Figure 9:
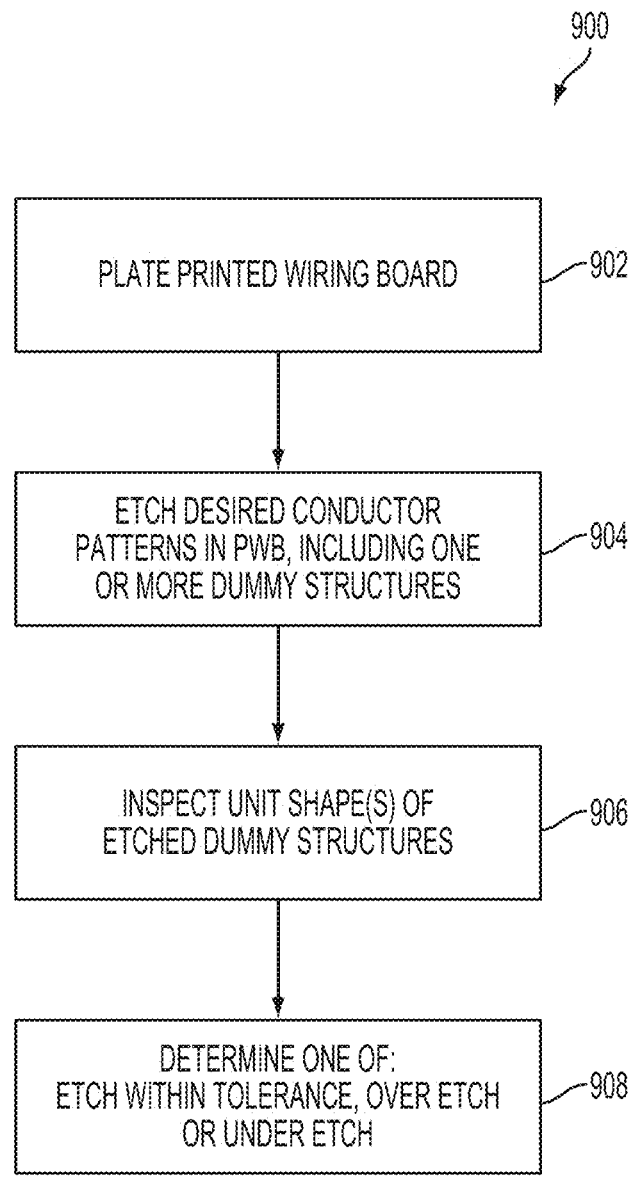
FIG. 9 is a flow diagram illustrating a method of performing visual inspection for printed wiring board etching, in accordance with another exemplary embodiment.

Referring now to FIG. 9, there is shown a flow diagram illustrating a method 900 of performing visual inspection for printed wiring board etching, in accordance with another exemplary embodiment. In block 902, one or more plating operations for a printed wiring board are performed to form one or more conductive materials on a substrate. Prior to plating, a plate resist may be applied to the critical portion(s) of the PWB in order to protect the critical portion(s) from plating steps and to maintain the critical portion at a predetermined thickness. The one or more conductive materials may include, but are not necessarily limited to, conductive metals and conductive non-metals. Suitable conductive metals include, but are not limited to, copper, tin, silver, gold, or combinations thereof. Suitable conductive non-metals include, but are not limited to, graphite, gallium arsenide, and silicon carbide.

In block 904, desired conductor patterns are etched into the PWB. Such structures may include distributed band pass filter or any circuit components formed from conductive materials, as well as at least one dummy structure as described above. Following the etching, in block 906 a unit shape(s) of the etched one or more dummy structures is visually inspected. Based on the appearance of the shape, the inspection allows for a determination in block 908 that: the etch of the circuit components was performed within a desired tolerance, the structures were over etched, or the structures were under etched.

In addition, it is also contemplated that inspection of the shape may also be accomplished in an automated fashion in a circuit card assembly (CCA) manufacturing environment utilizing flying probe impedance testing. A flying probe is a common test apparatus for newly populated CCAs, and measures impedance between combinations of all or some nodes on the circuit card. Beyond the visual inspection method, the flying probe test may also measure impedance (open/short) between neighboring diamond patterns in the etched feature (see, e.g., FIGS. 5 & 7).

As will thus be appreciated, among the technical benefits of the above described embodiments is the ability to provide a simple, visual tool to an assembler or tester that a key performance characteristic, such as PWB etch tolerance, is out of range. Even on structures that may not have critical etched filters, certain common components are typically included in the design for an RF CCA such as, for example, couplers, splitters and 50Ω lines. Each of these components may require certain tolerancing in order to guarantee performance and, as such, may benefit from having dummy test structures formed on the assembly.

Embodiments of the above described dummy structure may be selectively placed on the PWB, for example near the key element(s) having a tight tolerance, or in an unused area. It will further be appreciated that the dummy structure embodiments as described can be made larger or smaller than the above examples, and also provide a different range of etching increments (e.g., +/−2 mils, +/−1 mil, 0). Where key dimensions are not measured on a 100% basis, this feature may allow a user to visually inspect board etching to within about 0.5 mils.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A dummy structure for a printed wiring board (PWB), the structure comprising:
   a unit shape defined on the PWB, the unit shape configured to, based on a visual inspection thereof, provide an indication of one of: etching of a PWB circuit element within a desired tolerance range, over etching of the PWB circuit element, or under etching of the PWB circuit element;
   wherein the unit shape comprises a pair of isosceles triangle regions having opposing base sides, and for a case of the PWB circuit element etched within the desired tolerance range, apex vertices of the triangle regions meet at a common apex point.

2. The structure of claim 1, wherein for a case of the PWB circuit element being over etched, the apex vertices of the triangle regions are spaced apart so as to define a gap therebetween.

3. The structure of claim 2, wherein for a case of the PWB circuit element being under etched, the apex vertices of the triangle regions are overlapped with one another.

4. The structure of claim 2, wherein an apex angle, θ, for the triangle regions is selected so as to provide a determinable etch amplification in the over etched case.

5. The structure of claim 4, wherein θ is about 29° such that g=4e, wherein g represents the gap between the apex vertices in the over etched case, and e represents an over etching error.

6. The structure of claim 1, wherein the unit shape is formed from a same material as the PWB circuit element.

7. A dummy structure for a printed wiring board (PWB), the structure comprising:
   a plurality of unit shapes formed adjacent one another on the PWB, a middle one of the unit shapes having a nominally defined size, with adjacent unit shapes on a first side of the middle unit shape being formed incrementally smaller than the middle unit shape, and adjacent unit shapes on a second side of the middle unit shape being formed incrementally larger than the middle unit shape;
   where each of the plurality of unit shapes is configured to, based on a visual inspection thereof, provide an indication of one of: etching of a PWB circuit element within a desired tolerance range, over etching of the PWB circuit element, or under etching of the PWB circuit element.

8. The structure of claim 7, wherein each of the plurality of unit shapes comprises a pair of isosceles triangle regions having opposing base sides, and for a case of the PWB circuit element etched within the desired tolerance range:
   apex vertices of the triangle regions of the middle unit shape meet at a common apex point;
   apex vertices of the incrementally smaller unit shapes are spaced apart so as to define a gap therebetween, the gaps being incrementally larger for each incrementally smaller unit shape; and
   apex vertices of the incrementally larger unit shapes are overlapped with one another so as to define a center thickness in the y-direction, the center thickness being incrementally larger for each incrementally smaller unit shape.

9. The structure of claim 8, wherein for a case of the PWB circuit element being over etched, the apex vertices of the triangle regions of the middle unit shape are spaced apart so as to define a gap therebetween.

10. The structure of claim 9, wherein for a case of the PWB circuit element being under etched, the apex vertices of the triangle regions of the middle unit shape are overlapped with one another.

11. The structure of claim 9, wherein an apex angle, θ, for the triangle regions is selected so as to provide a determinable etch amplification in the over etched case.

12. The structure of claim 11, wherein θ is about 29° such that g=4e, wherein g represents the gap between the apex vertices in the over etched case, and e represents an over etching error.

13. A method of forming a printed wiring board (PWB), the method comprising:
   forming a circuit element and a dummy structure on a substrate; and
   visually inspecting the dummy structure, and based on the appearance of the dummy structure determining one of: etching of the circuit element within a desired tolerance range, over etching of the circuit element, or under etching of the circuit element;
   wherein the dummy structure has a unit shape comprising:
   a pair of isosceles triangle regions having opposing base sides; and
   for a case of the circuit element etched within the desired tolerance range, apex vertices of the triangle regions meet at a common apex point.

14. The method of claim 13, wherein:
   for a case of the circuit element being over etched, the apex vertices of the triangle regions are spaced apart so as to define a gap therebetween; and
   for a case of the circuit element being under etched, the apex vertices of the triangle regions are overlapped with one another.

15. The method of claim 14, wherein an apex angle, θ, for the triangle regions is selected so as to provide a determinable etch amplification in the over etched case.

16. The method of claim 15, wherein θ is about 29° such that g=4e, wherein g represents the gap between the apex vertices in the over etched case, and e represents an over etching error.

17. A method of forming a printed wiring board (PWB), the method comprising:
   forming a circuit element and a dummy structure on a substrate; and
   visually inspecting the dummy structure, and based on the appearance of the dummy structure determining one of: etching of the circuit element within a desired tolerance range, over etching of the circuit element, or under etching of the circuit element, wherein the dummy structure further comprises:
   a plurality of unit shapes formed adjacent one another on the substrate, a middle one of the unit shapes having a nominally defined size, with adjacent unit shapes on a first side of the middle unit shape being formed incrementally smaller than the middle unit shape, and adjacent unit shapes on a second side of the middle unit shape being formed incrementally larger than the middle unit shape.

18. The method of claim 17, wherein:
   each of the plurality of unit shapes comprises a pair of isosceles triangle regions having opposing base sides, and for a case of the PWB circuit element etched within the desired tolerance range, apex vertices of the triangle regions of the middle unit shape meet at a common apex point, apex vertices of the incrementally smaller unit shapes are spaced apart so as to define a gap therebetween, the gaps being incrementally larger for each incrementally smaller unit shape, and apex vertices of the incrementally larger unit shapes are overlapped with one another so as to define a center thickness in the y-direction, the center thickness being incrementally larger for each incrementally smaller unit shape;
   for a case of the PWB circuit element being over etched, the apex vertices of the triangle regions of the middle unit shape are spaced apart so as to define a gap therebetween; and
   for a case of the PWB circuit element being under etched, the apex vertices of the triangle regions of the middle unit shape are overlapped with one another.

* * * * *